United States Patent
Nakamura et al.

(10) Patent No.: US 9,697,990 B2
(45) Date of Patent: Jul. 4, 2017

(54) ETCHING METHOD FOR A STRUCTURE PATTERN LAYER HAVING A FIRST MATERIAL AND SECOND MATERIAL

(71) Applicant: Tokyo Electron Limited, Minato-ku, Tokyo (JP)

(72) Inventors: Satoru Nakamura, Albany, NY (US); Akiteru Ko, Schenectady, NY (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 15/352,112

(22) Filed: Nov. 15, 2016

(65) Prior Publication Data

US 2017/0140899 A1    May 18, 2017

Related U.S. Application Data

(60) Provisional application No. 62/364,149, filed on Jul. 19, 2016, provisional application No. 62/255,770, filed on Nov. 16, 2015.

(51) Int. Cl.
| | |
|---|---|
| *B44C 1/22* | (2006.01) |
| *C03C 15/00* | (2006.01) |
| *C03C 25/68* | (2006.01) |
| *C23F 1/00* | (2006.01) |
| *H01J 37/32* | (2006.01) |
| *H01L 21/3065* | (2006.01) |
| *H01L 21/308* | (2006.01) |
| *H01L 21/67* | (2006.01) |

(52) U.S. Cl.
CPC .... *H01J 37/32082* (2013.01); *H01J 37/3244* (2013.01); *H01J 37/32532* (2013.01); *H01L 21/3065* (2013.01); *H01L 21/3081* (2013.01); *H01L 21/67069* (2013.01); *H01J 2237/334* (2013.01)

(58) Field of Classification Search
USPC .......................................... 216/67; 438/703
See application file for complete search history.

(56) References Cited

U.S. PATENT DOCUMENTS

| | | | |
|---|---|---|---|
| 7,579,278 B2 | 8/2009 | Sandhu | |
| 7,723,009 B2 | 5/2010 | Sandhu et al. | |
| 8,853,085 B1* | 10/2014 | Abdallah | H01L 21/3081 |
| | | | 257/E21.035 |
| 2014/0272723 A1 | 9/2014 | Somervell et al. | |

\* cited by examiner

*Primary Examiner* — Roberts Culbert

(57) ABSTRACT

Provided is a method of plasma etching on a substrate using an etchant gas mixture to meet integration objectives, the method comprising: disposing a substrate having a structure pattern layer, a neutral layer, and an underlying layer, the structure pattern layer comprising a first material and a second material and the underlying layer comprising a silicon anti-reflective (SiARC) layer, a spin-on carbon hardmask (CHM) layer, an oxide layer, and a target layer; performing an first etch process to selectively remove the second material and the neutral layer using a first etchant gas mixture to form a first pattern; performing an second etch process to selectively remove the SiARC layer to form a second pattern; performing an third etch process to selectively remove the CHM layer to form a third pattern; concurrently controlling selected two or more operating variables wherein the first etchant gas include oxygen and sulfur-containing gases.

23 Claims, 10 Drawing Sheets

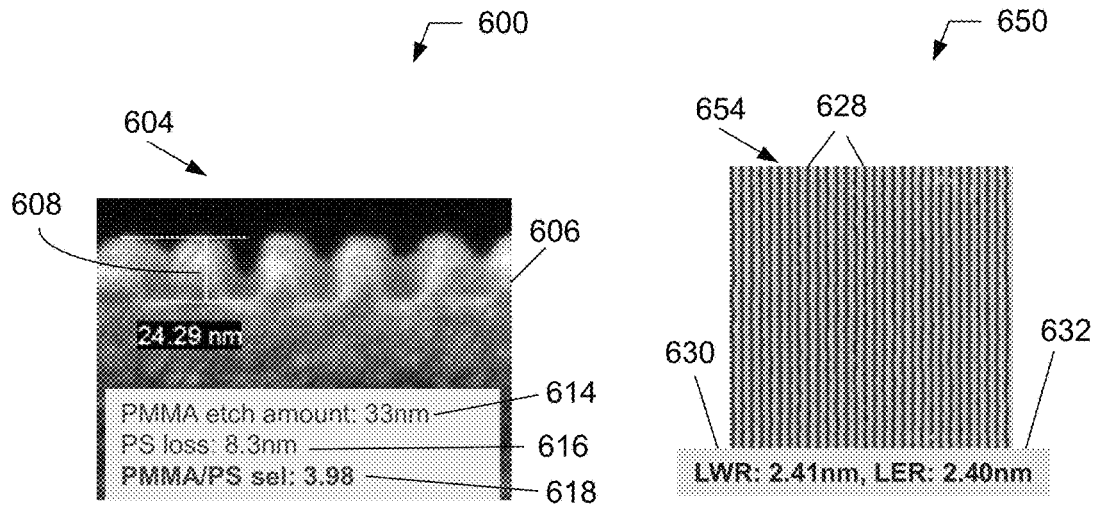
FIG. 6A1  FIG. 6A2
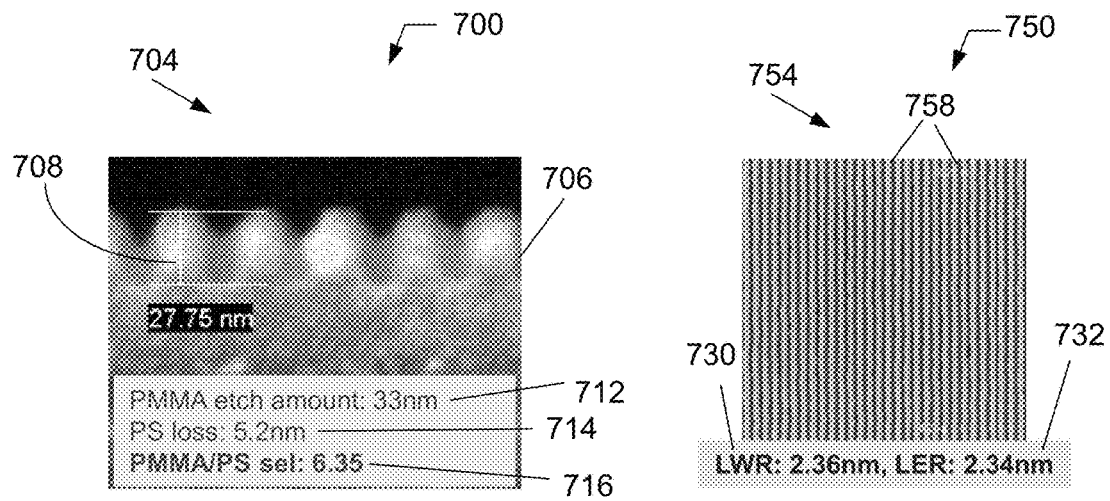
FIG. 7A1  FIG. 7A2

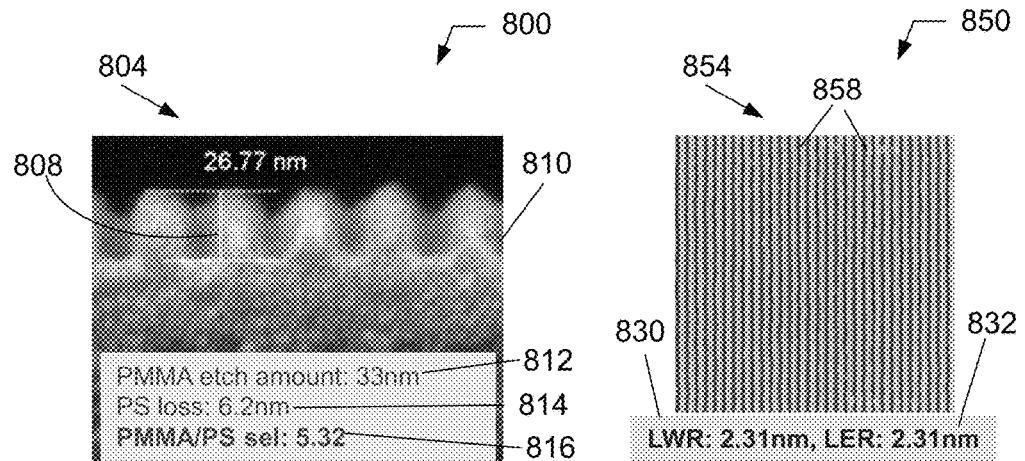
FIG. 8A1    FIG. 8A2
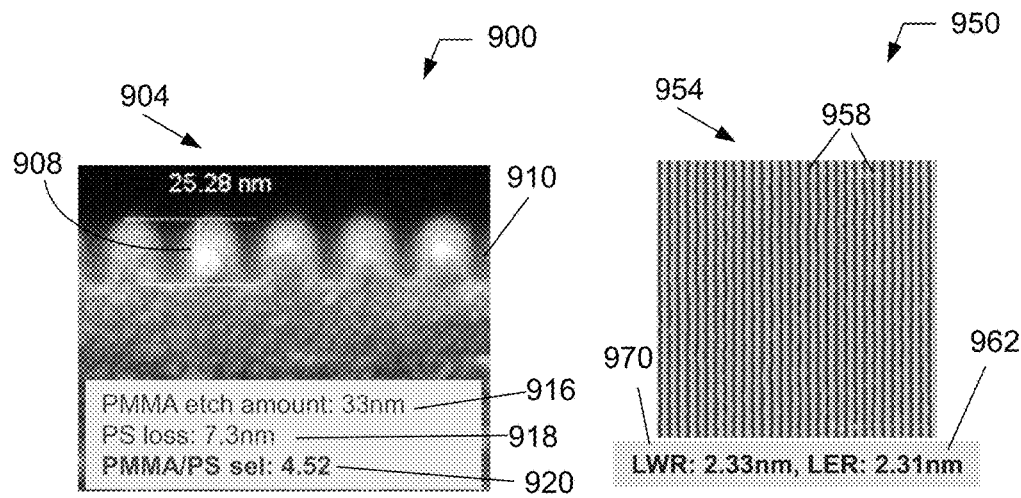
FIG. 9A1    FIG. 9A2

ETCHING METHOD FOR A STRUCTURE PATTERN LAYER HAVING A FIRST MATERIAL AND SECOND MATERIAL

CROSS-REFERENCE TO RELATED APPLICATIONS

Pursuant to 37 C.F.R §1.78(a)(4), this application claims the benefit of and priority to U.S. Provisional Application No. 62/364,149, filed Jul. 9, 2016, and U.S. Provisional Application No. 62/255,770, filed Nov. 16, 2015, which is expressly incorporated by reference herein in its entirety.

FIELD OF THE INVENTION

The invention relates to a method for selectively etching a structure pattern layer having a first material and a second material and specifically to etching such layers with enhanced etch sensitivity with an etchant gas mixture resulting in improved line edge roughness (LER) and line width roughness (LWR) of the target structure.

BACKGROUND OF THE INVENTION

The need to remain competitive in cost and performance in the production of semiconductor devices has caused a continuous increase in device density of integrated circuits. To accomplish higher integration and miniaturization in a semiconductor integrated circuit, miniaturization of a circuit pattern formed on a semiconductor wafer must also be accomplished.

Photolithography is a standard technique used to manufacture semiconductor integrated circuitry by transferring geometric shapes and patterns on a mask to the surface of a semiconductor wafer. However, current state-of-the-art photolithography tools allow minimum feature sizes down to about 25 nm. Accordingly, new methods are needed to provide smaller features.

One type of structure pattern layer with a first and second material is a directed self-assembly (DSA) layer. DSA layers include self-assembly of block copolymers (BCPs) which has been considered a potential tool for improving the resolution to better values than those obtainable by prior art lithography methods alone. Block copolymers are compounds useful in nanofabrication because they may undergo an order-disorder transition on cooling below a certain temperature (order-disorder transition temperature $T_{OD}$) resulting in phase separation of copolymer blocks of different chemical nature to form ordered, chemically distinct domains with dimensions of tens of nanometers or even less than 10 nm. The size and shape of the domains may be controlled by manipulating the molecular weight and composition of the different block types of the copolymer. The interfaces between the domains may have widths of the order of 1 nm to 5 nm and may be manipulated by modification of the chemical compositions of the blocks of the copolymer.

A block copolymer may form many different phases upon self-assembly, dependent upon the volume fractions of the blocks, degree of polymerization within each block type (i.e., number of monomers of each respective type within each respective block), the optional use of a solvent and surface interactions. When applied in a thin film, the geometric confinement may pose additional boundary conditions that may limit the numbers of phases. In general, spherical (e.g., cubic), cylindrical (e.g., tetragonal or hexagonal) and lamellar phases (i.e., self-assembled phases with cubic, hexagonal or lamellar space-filling symmetry) are practically observed in thin films of self-assembled block copolymers, and the phase type observed may depend upon the relative volume fractions of the different polymer blocks. The self-assembled polymer phases may orient with symmetry axes parallel or perpendicular to the substrate and lamellar and cylindrical phases are interesting for lithography applications, as they may form line and spacer patterns and contact hole arrays, respectively, and may provide good contrast when one of the domain types is subsequently etched.

Two methods used to guide or DSA of a block copolymer onto a surface are grapho-epitaxy and chemical pre-patterning, also called chemi-epitaxy. In the grapho-epitaxy method, self-organization of a block copolymer is guided by topological pre-patterning of the substrate. A self-aligned block copolymer can form a parallel linear pattern with adjacent lines of the different polymer block domains in the trenches defined by the patterned substrate. For instance, if the block copolymer is a di-block copolymer with A and B blocks within the polymer chain, where A is hydrophilic and B is hydrophobic in nature, the A blocks may assemble into domains formed adjacent to a side-wall of a trench if the side-wall is also hydrophilic in nature. Resolution may be improved over the resolution of the patterned substrate by the block copolymer pattern subdividing the spacing of a pre-pattern on the substrate.

Accordingly, to achieve the advantages provided by grapho-epitaxy and chemi-epitaxy of block copolymers, new lithographic patterning and DSA techniques are required, including the ability to integrate such materials in patterning workflows. One example of a block copolymer is polystyrene-b-poly(methyl methacrylate) (PMMA). However, when removing the PMMA portion from the polystyrene-b-poly(methyl methacrylate) (PS-b-PMMA) layer to leave behind a polystyrene (PS) pattern, conventional etching techniques have suffered. Due to the organic nature of both materials, and their similarities, developing an etch chemistry with suitable etch selectivity has been challenging. Furthermore, conventional etch processes produce pattern defectivity, such as line edge roughness/line width roughness (LER/LWR), that are unacceptable as per the semiconductor device performance requirements. In extreme cases, the defectivity of the PS can be catastrophic due to pattern collapse as will be discussed in more detail below.

In future schemes, the ability to selectively remove one material while retaining the other material using dry etching techniques is paramount for the success for such patterning implementation. In addition, as mentioned above, acceptable LER, LWR, and etch selectivity are major factors that determine usefulness of an integration scheme that is used for a self-aligned quadruple patterning (SAQP) process. The current methods do not provide the LER and the LWR that are required as the need for higher density patterns increases. Furthermore, there is also a need to ascertain the combination of gases and relative flowrates or ratios of etchant gases to each other that provide the etch sensitivity required while maintaining or improving the other metrics of the integration scheme. Overall, there is a need for controlled etching techniques, processes, etchant gas combinations, and ratios of etchant gases that produce acceptable etch selectivity, LER, and LWR results that enable achieving integration objectives when processing smaller feature patterns.

SUMMARY OF THE INVENTION

Provided is a method of plasma etching on a substrate using an etchant gas mixture to meet integration objectives, the method comprising: disposing a substrate having a structure pattern layer, a neutral layer, and an underlying layer, the structure pattern layer comprising a first material and a second material and the underlying layer comprising a silicon anti-reflective coating (SiARC) layer, a spin-on carbon hardmask (CHM) layer, an oxide layer, and a target layer; performing a first etch process to selectively remove the second material and the neutral layer using a first etchant gas mixture to form a first pattern; performing a second etch process to selectively remove the SiARC layer to form a second pattern; performing a third etch process to selectively remove the CHM layer to form a third pattern; concurrently controlling selected two or more operating variables wherein the first etchant gas mixture include oxygen and sulfur-containing gases.

Also included is a system for patterning a layer on a substrate using a patterning system, the system comprising: a plasma etch system configured to etch a substrate having a structure pattern layer, a neutral layer, and an underlying layer, the structure pattern layer comprising a first material and a second material and the underlying layer comprising a silicon anti-reflective coating (SiARC) layer, a spin-on carbon hardmask (CHM) layer, an oxide layer, and a target layer; the plasma etch system comprising: a process chamber configured to process the substrate using a first etchant gas mixture; a second etchant gas mixture, a third etchant gas mixture; a plasma source configured to deliver plasma ions and radicals into a center flow and an edge flow using a radical distribution control device; a top electrode and a bottom electrode coupled to the process chamber and configured to adjust a gap of the top electrode to the bottom electrode; and an active temperature control chuck configured with a dual zone temperature control and coupled to the process chamber; and a controller coupled to the plasma etch system, the controller configured to control operating variables in order to meet integration objectives; wherein the first etchant gas mixtures includes an oxygen-containing gas, sulfur-containing gas, and a diluent gas; and wherein the integration objectives comprise a target line edge roughness (LER) in a range from 1.30 to 3.30 nm and a target line width roughness (LWR) in a range from 1.70 to 4.20 nm.

BRIEF DESCRIPTION OF THE DRAWINGS

In the accompanying drawings:

FIG. 2A depicts an image of a top-view of a structure in a substrate after a PMMA etch using argon and oxygen-containing gas while FIG. 2B depicts an image of a top-view of the structure in the substrate after a previous PMMA etch using argon, oxygen-containing gas, and sulfur-containing gas with the ratio of sulfur-containing gas to the total of the sulfur and oxygen-containing gases of 1:1, according to an embodiment of the present invention.

FIG. 3A depicts an image of a top-view of a structure in a substrate after a CHM etch process where the previous PMMA etch used argon and oxygen-containing gas mixture only, i.e. no sulfur-containing gas in the gas mixture while FIG. 3B depicts an image of a top-view of a substrate after a CHM etch process where the previous PMMA etch used argon, oxygen-containing gas, and sulfur-containing gas with a ratio of sulfur-containing gas to the total sulfur and oxygen-containing gases of 1:1, according to an embodiment of the present invention.

FIG. 4A depicts an image of a top-view of a structure in a substrate after a previous PMMA etch process using argon and oxygen-containing gas mixture while FIG. 4B depicts an image of a top-view of a substrate after a previous PMMA etch process using argon, oxygen-containing gas, and sulfur-containing gas mixture, with the ratio of sulfur-containing gas to the total of the sulfur and oxygen-containing gases of 1:1, according to an embodiment of the present invention.

FIG. 5A depicts an image of a top-view of a substrate after a CHM etch process where the previous PMMA etch process used argon and oxygen-containing gas mixture while FIG. 5B depicts an image of a top-view of a substrate after a CHM etch process where the previous PMMA etch process used argon, oxygen-containing gas, and sulfur-containing gas, with the ratio of sulfur-containing gas to the total of the sulfur and oxygen-containing gases of 1:1, according to an embodiment of the present invention.

FIG. 6A1 depicts an image of a side-view of a substrate after a previous PMMA etch process using argon and oxygen-containing gas mixture while FIG. 6A2 depicts an image of a top-view of a substrate after a previous PMMA etch process using argon and oxygen-containing gas, with zero sulfur-containing gas according to an embodiment of the present invention.

FIG. 7A1 depicts an image of a side-view of a substrate after a previous PMMA etch process while FIG. 7A2 depicts an image of a top-view of the substrate after a previous PMMA etch process using argon, oxygen-containing gas, and sulfur-containing gas mixture, with the ratio of sulfur-containing gas to the total of the sulfur and oxygen-containing gases of 25:75 sccm or 33%, according to an embodiment of the present invention.

FIG. 8A1 depicts an image of a side-view of a structure in a substrate after a PMMA etch process while FIG. 8A2 depicts an image of a top-view of the substrate after the PMMA etch process using argon, oxygen-containing gas, and sulfur-containing gas mixture, with the ratio of sulfur-containing gas to the total of the sulfur and oxygen-containing gases of 25:50 sccm or 50%, according to an embodiment of the present invention.

FIG. 9A1 depicts an image of a side-view of a structure in a substrate after a PMMA etch process while FIG. 9A2 depicts an image of a top-view of the substrate after the PMMA etch process using argon, oxygen-containing gas, and sulfur-containing gas mixture, with the ratio of sulfur-containing gas to the total of the sulfur and oxygen-containing gases of 25:37.5 sccm or 67%, according to an embodiment of the present invention.

DETAILED DESCRIPTION OF SEVERAL EMBODIMENTS

Figure 1A:
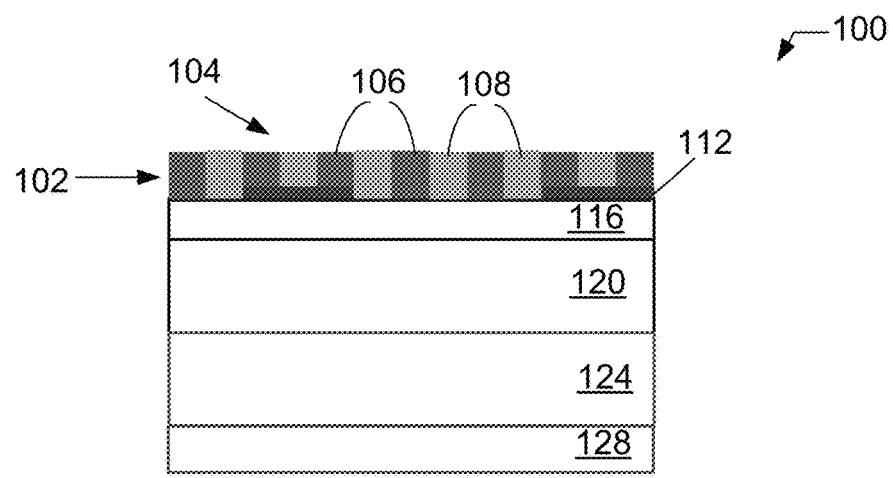
FIG. 1A depicts a schematic of an input substrate with a structure in a pattern layer that includes a first material and a second material in a layer, a neutral layer, and an underlying layer in a patterning process.

In the following description, for purposes of explanation and not limitation, specific details are set forth, such as a particular geometry of a processing system, descriptions of various components and processes used therein. However, it should be understood that the invention may be practiced in other embodiments that depart from these specific details.

Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Various operations will be described as multiple discrete operations in turn, in a manner that is most helpful in understanding the invention. However, the order of description should not be construed as to imply that these operations are necessarily order dependent. In particular, these operations need not be performed in the order of presentation. Operations described may be performed in a different order than the described embodiment. Various additional operations may be performed and/or described operations may be omitted in additional embodiments.

As used herein, the term "radiation sensitive material" means and includes photosensitive materials such as photoresists.

As used herein, the term "polymer block" means and includes a grouping of multiple monomer units of a single type (i.e., a homopolymer block) or multiple types (i.e., a copolymer block) of constitutional units into a continuous polymer chain of some length that forms part of a larger polymer of an even greater length and exhibits a χN value, with other polymer blocks of unlike monomer types, that is sufficient for phase separation to occur. X is the Flory-Huggins interaction parameter and N is the total degree of polymerization of the block copolymer. According to embodiments of the present invention, the χN value of one polymer block with at least one other polymer block in the larger copolymer may be equal to or greater than about 10.5.

As used herein, the term "block copolymer" means and includes a polymer composed of chains where each chain contains two or more polymer blocks as defined above and at least two of the blocks are of sufficient segregation strength (e.g., χN>10.5) for those blocks to phase separate. A wide variety of block polymers are contemplated herein including di-block copolymers (i.e., polymers including two polymer blocks (AB)), tri-block copolymers (i.e., polymers including three polymer blocks (ABA or ABC)), multi-block copolymers (i.e., polymers including more than three polymer blocks (ABCD, etc.)), and combinations thereof.

"Substrate" as used herein generically refers to the object being processed in accordance with the invention. The substrate may include any material portion or structure of a device, particularly a semiconductor or other electronics device, and may, for example, be a base substrate structure, such as a semiconductor wafer or a layer on or overlying a base substrate structure such as a thin film. The substrate may be a conventional silicon substrate or other bulk substrate comprising a layer of semi-conductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped. Thus, substrate is not intended to be limited to any particular base structure, underlying layer or overlying layer, patterned or un-patterned, but rather, is contemplated to include any such layer or base structure, and any combination of layers and/or base structures. The description below may reference particular types of substrates, but this is for illustrative purposes only and not limitation.

The terms "microphase segregation" and "microphase separation," as used herein mean and include the properties by which homogeneous blocks of a block copolymer aggregate mutually, and heterogeneous blocks separate into distinct domains. In the bulk, block copolymers can self-assemble into ordered morphologies, having spherical, cylindrical, and lamellar, bicontinuous gyroid, or miktoarm star micro domains, where the molecular weight of the block copolymer dictates the sizes of the micro domains formed.

The domain size or pitch period ($L_o$) of the self-assembled block copolymer morphology may be used as a basis for designing critical dimensions of the patterned structure. Similarly, the structure period ($L_s$), which is the dimension of the feature remaining after selectively etching away one of the polymer blocks of the block copolymer, may be used as a basis for designing critical dimensions of the patterned structure. The lengths of each of the polymer blocks making up the block copolymer may be an intrinsic limit to the sizes of domains formed by the polymer blocks of those block copolymers. For example, each of the polymer blocks may be chosen with a length that facilitates self-assembly into a desired pattern of domains, and shorter and/or longer copolymers may not self-assemble as desired.

The term "annealing" or "anneal" as used herein means and includes treatment of the block copolymer so as to enable sufficient microphase segregation between the two or more different polymeric block components of the block copolymer to form an ordered pattern defined by repeating structural units formed from the polymer blocks. Annealing of the block copolymer in the present invention may be achieved by various methods known in the art, including, but not limited to: thermal annealing (either in a vacuum or in an inert atmosphere, such as nitrogen or argon), solvent vapor-assisted annealing (either at or above room temperature), supercritical fluid-assisted annealing, or absorption-based annealing (e.g., optical baking). As a specific example, thermal annealing of the block copolymer may be conducted by exposing the block copolymer to an elevated temperature that is above the glass transition temperature ($T_g$), but below the degradation temperature ($T_d$) of the block copolymer, as described in greater detail hereinafter. Other conventional annealing methods not described herein may also be utilized.

The ability of block copolymers to self-organize may be used to form mask patterns. Block copolymers are formed of two or more chemically distinct blocks. For example, each block may be formed of a different monomer. The blocks are immiscible or thermodynamically incompatible, e.g., one block may be polar and the other may be non-polar. Due to thermodynamic effects, the copolymers will self-organize in solution to minimize the energy of the system as a whole; typically, this causes the copolymers to move relative to one another, e.g., so that identical blocks aggregate together, thereby forming alternating regions containing each block type or species. For example, if the copolymers are formed of polar (e.g., organometallic containing polymers) and non-polar blocks (e.g., hydrocarbon polymers), the blocks will segregate so that non-polar blocks aggregate with other non-polar blocks and polar blocks aggregate with other polar blocks. It will be appreciated that the block copolymers may be described as a self-assembling material since the blocks can move to form a pattern without active application of an external force to direct the movement of particular individual molecules, although heat may be applied to increase the rate of movement of the population of molecules as a whole.

In addition to interactions between the polymer block species, the self-assembly of block copolymers can be influenced by topographical features, such as steps or guides extending perpendicularly from the horizontal surface on which the block copolymers are deposited. For example, a di-block copolymer, a copolymer formed of two different polymer block species, may form alternating domains, or regions, which are each formed of a substantially different polymer block species. When self-assembly of polymer block species occurs in the area between the perpendicular walls of a step or guides, the steps or guides may interact with the polymer blocks such that, e.g., each of the alternating regions formed by the blocks is made to form a regularly spaced apart pattern with features oriented generally parallel to the walls and the horizontal surface.

Such self-assembly can be useful in forming masks for patterning features during semiconductor fabrication processes. For example, one of the alternating domains may be removed, thereby leaving the material forming the other region to function as a mask. The mask may be used to pattern features such as electrical devices in an underlying semiconductor substrate. Methods for forming a block copolymer mask are disclosed in U.S. Pat. No. 7,579,278; U.S. Pat. No. 7,723,009, and to U.S. application Ser. No. 13/830,859, CHEMI-EPITAXY IN DIRECTED SELF-ASSEMBLY APPLICATIONS USING PHOTO-DECOMPOSABLE AGENTS, by Sommervell, et al., filed on Mar. 14, 2013, the entire disclosure of each of which is incorporated by reference herein.

In material processing methodologies, pattern etching can comprise the application of a thin layer of radiation-sensitive material, such as photo-resist, to an upper surface of a substrate, followed by patterning of the thin layer of material using lithographic techniques. In DSA patterning, the initial pattern is formed by the phase-separation of two or more phases present in a DSA layer, the selective removal of at least one phase using dry pattern etching, and the retention of at least one remaining phase, thereby providing a pattern for subsequent dry pattern etching. During dry pattern etching, a plasma etching process can be utilized, wherein plasma is formed from a process gas by coupling electromagnetic (EM) energy, such as radio frequency (RF) power, to the process gas in order to heat electrons and cause subsequent ionization and dissociation of the atomic and/or molecular constituents of the process gas. Using a series of dry etching processes, the initial pattern may be formed in the DSA layer, followed by transfer of the pattern to the underlying layers within a film stack, including the one or more material layers that are desired for the end product, e.g., electronic device. To do so, the selective removal of one material relative to other material(s) is necessary. And, among other things, during the pattern transfer process, profile control for the pattern extended into underlying layers is of critical importance.

As described above, directed self-assembled block copolymer layers, such as polystyrene-b-poly(methyl methacrylate) (PS-b-PMMA), have proven useful in sub-22 nm patterning schemes. However, to remove the self-assembled PMMA portion while retaining the PS portion, a highly selective etch process is required.

Referring now to the drawings, wherein like reference numerals designate identical or corresponding parts throughout the several views, FIG. 1A depicts a schematic 100 of an input substrate 104 with a structure pattern layer 102 that includes a first material 106 and a second material 108 in the structure pattern layer 102, a neutral layer 112, and an underlying layer in a patterning process. In an embodiment, the structure pattern layer 102 is a block copolymer (BCP) comprising a first block copolymer 106 and a second copolymer 108. The first block copolymer 106 can be PMMA and a second copolymer 108 can be polystyrene. Connecting two adjacent first block copolymer 106 is a neutral layer 112. The next layers of the underlying layer can include silicon anti-reflective coating (SiARC) layer 116, spin-on carbon hard mask (CHM) layer 120, an oxide layer 124, and a silicon layer 128. The technology for fabricating the DSA pattern and the layers of the underlying layer is discussed above and is known to people in the art.

Figure 1B:
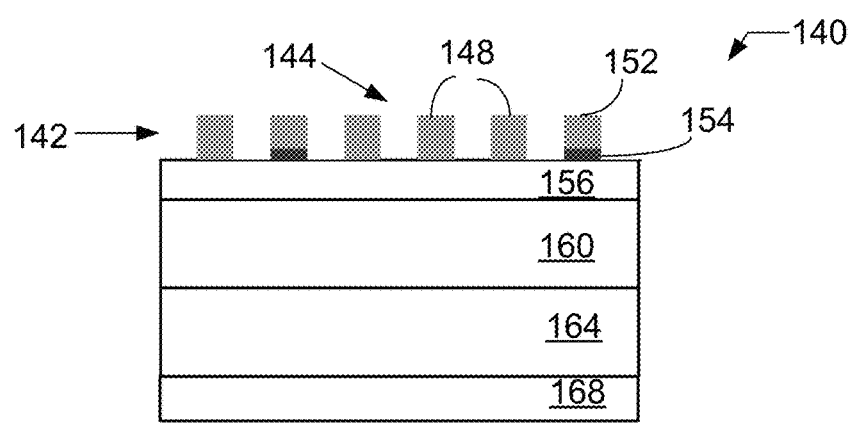
FIG. 1B depicts a schematic of a substrate after the copolymer and neutral layer etch processes in a DSA patterning processing according to an embodiment of the present invention.

FIG. 1B depicts a schematic 140 of a substrate 144 after the first copolymer and portions of neutral layer are etched in the DSA patterning process (and will be referred to as "previous PMMA etch"), leaving the second copolymer 148 and portions of the neutral layer 154. The next layers can include a SiARC layer 156, a spin-on CHM layer 160, an oxide layer 164, and a silicon layer 168.

Figure 1C:
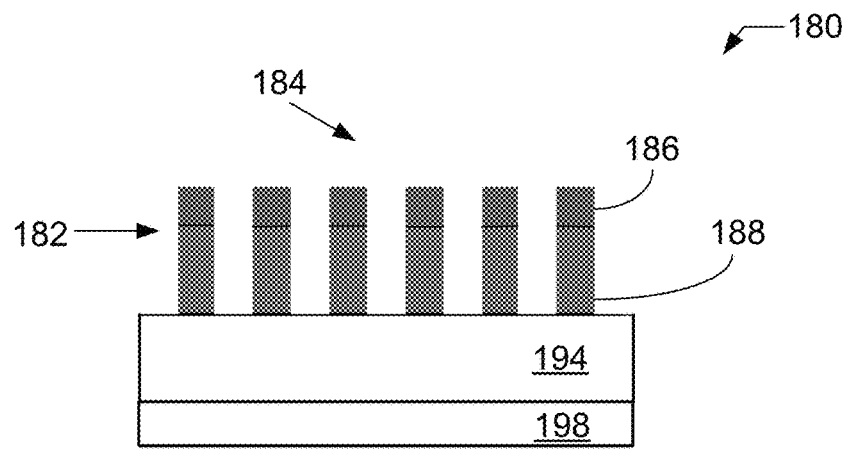
FIG. 1C illustrate a schematic of a substrate after the SiARC and carbon hard mask (CHM) etch processes in a DSA patterning process according to an embodiment of the present invention.

FIG. 1C depicts a schematic 180 of a substrate 184 after the SiARC and CHM etch processes in a DSA patterning process. The structure pattern 182 comprises a SiARC portion 186 and a CHM portion 188. The next layers can include an oxide layer 194 and a silicon layer 198.

Figures 2A, 2B:
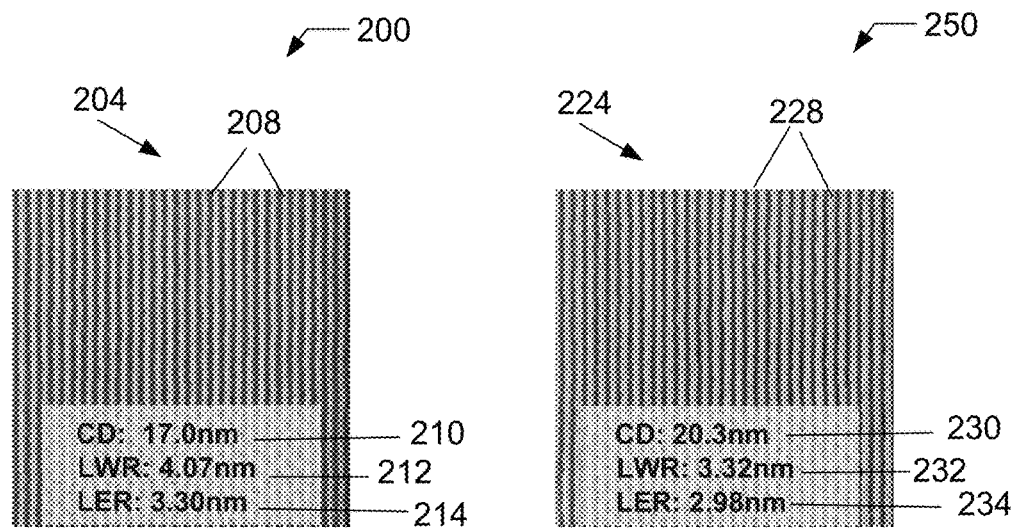

FIG. 2A depicts an image 200 of a top-view of a structure in a substrate 204 after a PMMA etch using argon and oxygen-containing gas only, i.e. no sulfur-containing gas in the gas mixture. Measurement of the lines and spaces 208 indicated a CD 210 of 17.0 nm, an LWR 212 of 4.07 nm, and an LER 214 of 3.30 nm.

FIG. 2B depicts an image of a top-view 250 of a structure in a substrate 224 after a PMMA etch using argon, oxygen-containing gas, and sulfur-containing gas with a ratio of sulfur-containing gas to the total oxygen-containing and sulfur-containing gases of 1:1 according to an embodiment of the present invention. Although argon is listed, other diluent or noble gases can also be used. The oxygen containing gas can include O2, CO, CO2, and the like. The sulfur containing gas can be SO2 or COS. Measurement of the lines and spaces 228 indicated a CD 230 of 20.3 nm, an LWR 232 of 3.32 nm, and an LER 234 of 2.98 nm. The substantial improvement in LER and LWR when the sulfur-containing gas was added to the gas mixture is a critical data for this invention and highly advantageous because LER and LWR of the patterns are severely impacted by the higher density requirements of current substrate fabrication.

Figures 3A, 3B:
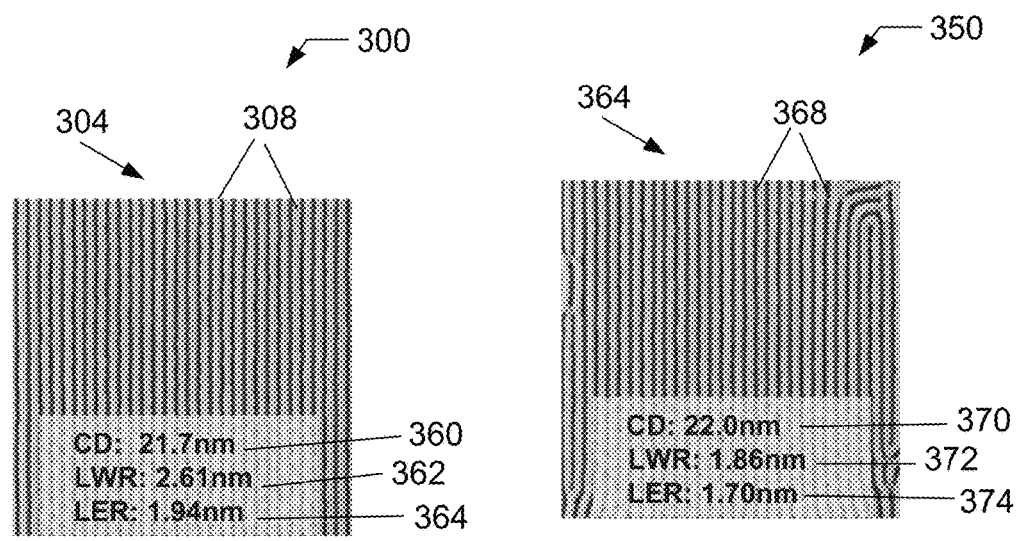

FIG. 3A depicts an image of a top-view 300 of a structure in a substrate 304 after a CHM etch process where the previous PMMA etch used argon and oxygen-containing gas mixture only in the, i.e. no sulfur-containing gas in the gas mixture. Measurement of the lines and spaces 308 indicated a CD 360 of 21.7 nm, an LWR 362 of 2.61 nm, and an LER 364 of 1.94 nm.

FIG. 3B depicts an image of a top-view 350 of a structure in a substrate 364 after a CHM etch process where the previous PMMA etch used argon, oxygen-containing gas, and sulfur-containing gas with a ratio of sulfur-containing gas to the total oxygen-containing and sulfur-containing gases of 1:1 according to an embodiment of the present invention. As mentioned above, other diluent or noble gases in addition to argon can also be used. The oxygen containing gas can include O2, CO, CO2, and the like. The sulfur-containing gas can be SO2 or COS. Measurement of the lines and spaces 368 indicated a CD 370 of 22.0 nm, an LWR 372 of 1.86 nm, and an LER 374 of 1.70 nm. The substantial improvement in LER and LWR when the sulfur-containing gas was added to the gas mixture is a critical data for this invention and highly advantageous because LER and LWR of the patterns were severely impacted by the higher density requirements of current substrate fabrication.

Figures 4A, 4B:
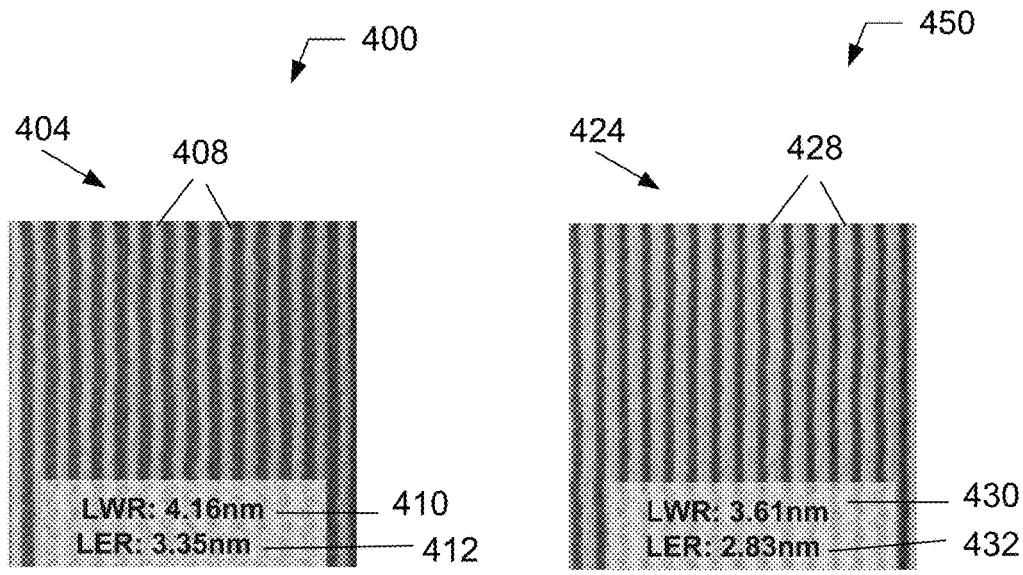

FIG. 4A depicts an image 410 of a top-view of a structure in a substrate 404 after a previous PMMA etch process using argon and oxygen-containing gas mixture only, i.e. no sulfur-containing gas in the gas mixture. Measurement of the lines and spaces 408 indicated an LWR 410 of 4.16 nm and an LER 412 of 3.35 nm.

FIG. 4B depicts an image 450 of a top-view of a structure in a substrate 424 after a PMMA etch process using argon, oxygen-containing gas, and sulfur-containing gas mixture, with a ratio of sulfur-containing gas to the total oxygen-containing and sulfur-containing gases of 1:1, according to an embodiment of the present invention. As mentioned above, other diluent or noble gases in addition to argon can also be used. The oxygen containing gas can include O2, CO, CO2, and the like. The sulfur containing gas can be SO2 or COS. Measurement of the lines and spaces 428 indicated an LWR 430 of 3.61 nm, and an LER 432 of 2.83 nm. As mentioned above, the substantial improvement in LER and LWR when the sulfur-containing gas was added to the gas mixture is a critical data for this invention and highly advantageous because LER and LWR of the patterns were severely impacted by the higher density requirements.

Figures 5A, 5B:
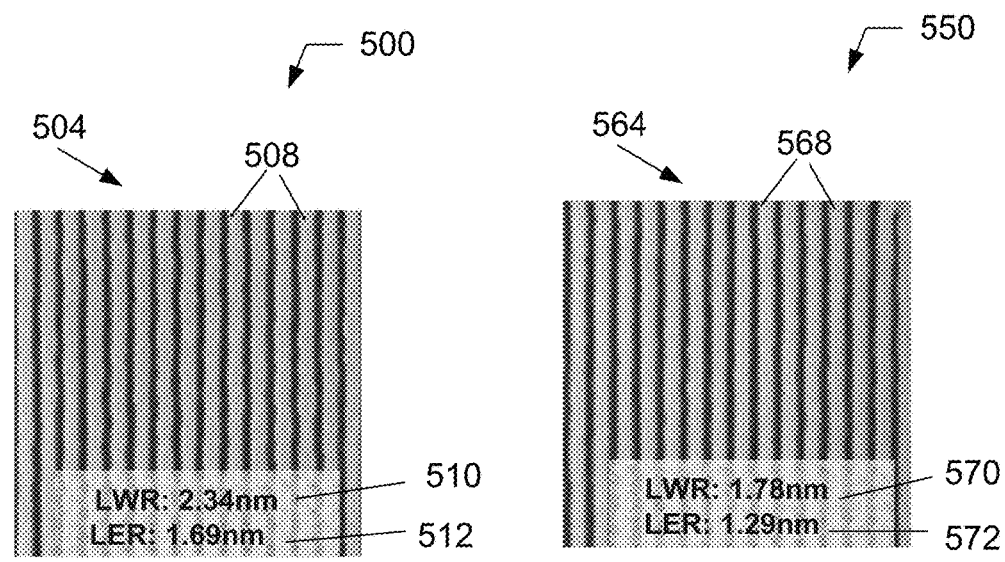

FIG. 5A depicts an image 500 of a top-view of a structure in a substrate 504 after a CHM etch process where the PMMA etch used oxygen-containing gas mixture only, i.e. no sulfur-containing gas in the gas mixture. Measurement of the lines and spaces 508 indicated an LWR 510 of 2.34 nm and an LER 512 of 1.69 nm.

FIG. 5B depicts an image 550 of a top-view of a substrate 564 after a CHM etch process where the previous PMMA etch used argon, an oxygen-containing gas, and sulfur-containing gas mixture with a ratio of sulfur-containing gas to the total oxygen-containing and sulfur-containing gases of 1:1, according to an embodiment of the present invention. As mentioned above, other diluent or noble gases in addition to argon can also be used. The oxygen-containing gas can include O2, CO, CO2, and the like. The sulfur-containing gas can be SO2 or COS. Measurement of the lines and spaces 568 indicated an LWR 570 of 1.78 nm, and an LER 572 of 1.29 nm. As mentioned above, the substantial improvement in LER from 2.34 to 1.78 nm and LWR from 1.69 to 1.29 when the sulfur-containing gas was added to the gas mixture in the previous PMMA etch is a critical data for this invention and highly advantageous because current LER and LWR of the patterns are severely impacted by the higher density requirements of current substrate fabrication.

FIG. 6A1 depicts an image 600 of a side-view of a structure 606 in a substrate 604 obtained using a cross-section scanning electron microscopy (XSEM) after a previous PMMA etch process using argon and oxygen-containing gas mixture only, i.e., no sulfur-containing gas in the gas mixture. The structure height 608 is 24.29 nm, the PMMA etch amount 614 is 33 nm, PS loss 616 is 8.3 nm, and the PMMA/PS selectivity 618 is 3.98. PMMA/PS selectivity for this base case will be used for comparing results on similar substrates treated with varying percentages of sulfur-containing gas in the figures below.

FIG. 6A2 depicts an image 650 of a top-view of a structure 628 of a substrate 654 referenced in FIG. 6A1 as 644, obtained using a critical dimension scanning electron microscopy (CDSEM) after a previous PMMA etch process using argon, oxygen-containing gas, and sulfur-containing gas where the LER 632 is 2.40 nm and the LWR 630 is 2.41. FIG. 6A1 and FIG. 6A2 are the base cases for comparing results on similar substrates treated with varying percentages of sulfur-containing gas used in the figures below.

FIG. 7A1 depicts an image 700 of a side-view of a structure 706 of a substrate 704 obtained using a XSEM after a previous PMMA etch process using argon, oxygen-containing, and sulfur-containing gas mixture. The structure height 708 is 27.75 nm, the PMMA etch amount 712 is 33 nm, PS loss 714 is 5.2 nm, and the PMMA/PS selectivity 716 is 6.35, which is a significant improvement over the base case of PMMA/PS selectivity of 3.98.

FIG. 7A2 depicts an image 750 of a top-view of a structure 758 of a substrate 754 obtained using CDSEM scan after a previous PMMA etch process using argon, oxygen-containing gas, and sulfur-containing gas mixture with a ratio of sulfur-containing gas to the total oxygen-containing and sulfur-containing gases of 25:75 sccm or 33%, according to an embodiment of the present invention. The LER 732 is 2.34 nm and the LWR 730 is 2.36 which represent roughness improvements compared to the base case LER of 2.40 nm and LWR of 2.41 nm.

FIG. 8A1 depicts an image 800 of a side-view of a structure 810 of a substrate 804 obtained using a XSEM after a previous PMMA etch process using argon, oxygen-containing and sulfur-containing gas mixture. The structure height 808 is 26.77 nm, the PMMA etch amount 812 is 33 nm, PS loss 814 is 6.2 nm, and the PMMA/PS selectivity 816 is 5.32, where the selectivity shows a significant improvement over the base case PMMA/PS selectivity of 3.98.

FIG. 8A2 depicts an image 850 of a top-view of a structure 858 of a substrate 854 obtained using a CDSEM after a previous PMMA etch process using argon, oxygen-containing gas, and sulfur-containing gas mixture with a ratio of sulfur-containing gas to the total oxygen-containing and sulfur-containing gases of 25:50 sccm or 50%, according to an embodiment of the present invention. The LER 830 is 2.40 nm and the LWR 832 is 2.41 represent roughness improvements to the base case LER of 2.40 nm and LWR of 2.41 nm.

FIG. 9A1 depicts an image 900 of a side-view of a structure 910 of a substrate 904 obtained using a XSEM after a previous PMMA etch process using argon and oxygen-containing gas, and sulfur-containing gas where the oxygen-containing gas to sulfur-containing gas ratio is 25:37.5 sccm or 67%. The structure height 908 is 25.28 nm, the PMMA etch amount 916 is 33 nm, PS loss 918 is 7.3 nm, and the PMMA/PS selectivity 920 is 4.52 which is a substantial improvement over the base case PMMA/PS selectivity of 3.98.

FIG. 9A2 depicts an image 950 of a top-view of a structure 958 substrate 954 obtained using a CDSEM after a previous PMMA etch process using argon, oxygen-containing gas, and sulfur-containing gas mixture with a ratio of sulfur-containing gas to the total oxygen-containing and sulfur-containing gases of 25:37.5 sccm or 67%, according to an embodiment of the present invention. The LER 962 is 2.31 nm and the LWR 970 is 2.33 which represent roughness improvements to the base case LER of 2.40 nm and LWR of 2.41 nm.

Based on the foregoing description of the figures, the inventors found out in their tests that controlled addition of sulfur-containing gases such as SO2 or COS improved the PMMA/PS etch selectivity substantially. The addition of sulfur-containing gases also improved the LER and LWR significantly in the etched substrates and this effect was not foreseen. As will be discussed in conjunction the FIG. 10 and FIG. 11, the impact on etch selectivity and line roughness was a non-linear correlation to the percentage of sulfur-containing gas to the total of the sulfur and oxygen-containing gases in the etchant gas mixture.

Figure 10:
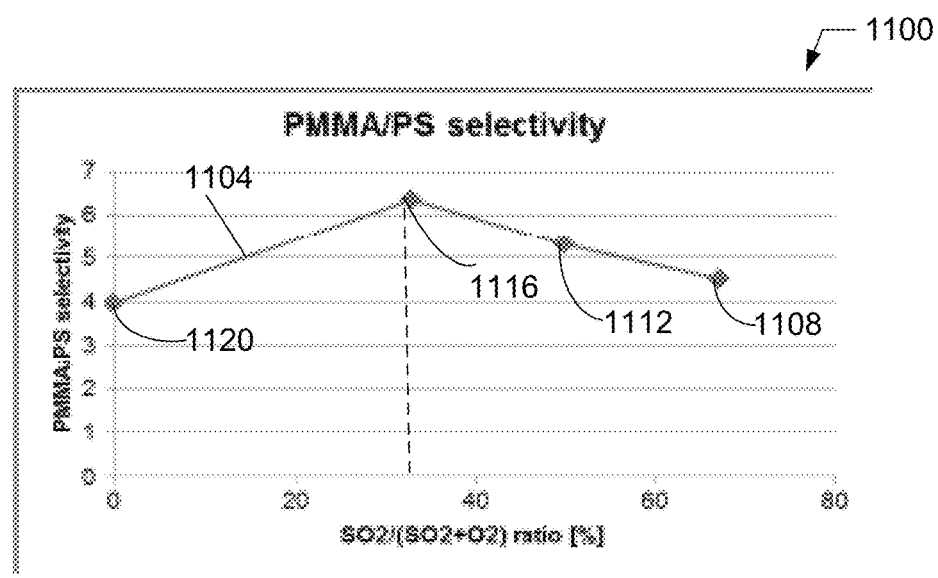
FIG. 10 depicts a graph of PMMA/PS etch selectivity as a function of the ratio of sulfur-containing gas compared to the total of sulfur and oxygen-containing gases, the ratio expressed as a percentage.

FIG. 10 depicts a graph 1100 showing a PMMA/PS etch selectivity curve 1104 as a function of the sulfur-containing gas to sulfur and oxygen-containing gases ratio expressed as percentage. The X-axis is the ratio expressed as a percentage of SO2 in the SO2 and O2 gas mixture while the Y-axis is the PMMA/PS etch selectivity. Starting from the left, the first data point 1120 represents 0% SO2 and the PMMA/PS etch selectivity of about 4.0; the second data point 1116 represents 32% SO2 and PMMA/PS etch selectivity of about 6.2; the third data point 1112 represents 51% SO2 and the PMMA/PS etch selectivity of about 5.2; and the fourth data point 1108 represents 72% SO2 and the PMMA/PS etch selectivity of about 4.5. A range from about 20 to 52% SO2 to the total of oxygen and sulfur-containing gases is a tighter range that can be used for controlling the percentage SO2 during the etch steps. The highest PMMA/PS etch selectivity is about 6.2 at about 32% SO2 to the total of oxygen and sulfur-containing gases. Other operating variables such as process chamber temperature, can also have an effect on the shape of the PMMA/PS selectivity curve 1104 but not as significant as the effect of percentage of SO2.

Figure 11:
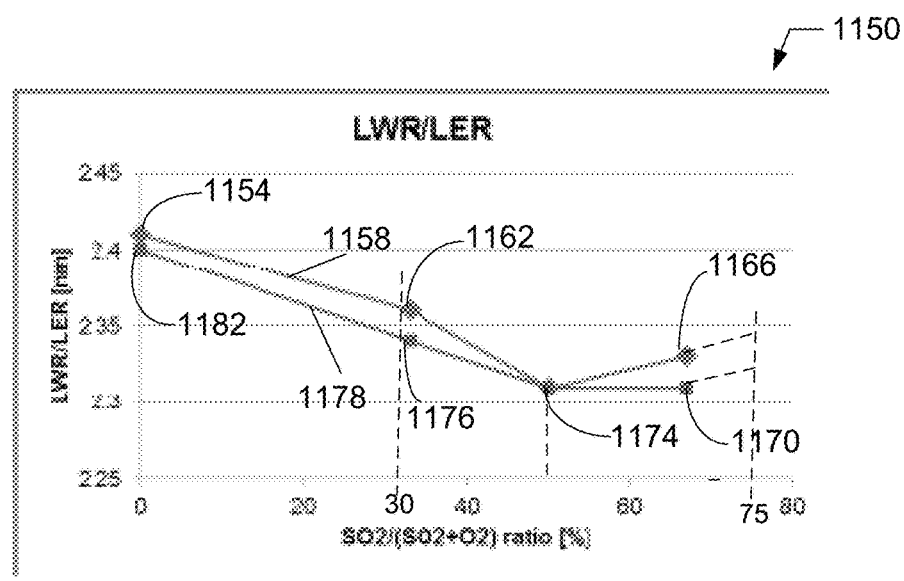
FIG. 11 depicts a graph of LER/LWR as a function of the ratio of sulfur-containing gas compared to the total of sulfur and oxygen-containing gas, the ratio expressed as percentage.

FIG. 11 depicts a graph 1150 of LWR/LER as a function of the SO2 gas to total SO2 plus O2 gas ratio expressed as a percentage. The X-axis is the ratio expressed as a percentage of SO2 in the SO2 and O2 gas mixture while the Y-axis is the LWR/LER in nm. Starting from the left, the LWR curve 1158 includes a first data point 1154 with 0% SO2 and LWR at 2.41 nm, a second data point 1162 and about 32% SO2 and LWR at 2.36 nm, a third data point 1174 and about 50% SO2, and a fourth data point 1166 and about 69% SO2.

Starting from the left, the LER curve 1178 includes a first data point 1182 with 0% SO2 and LER at 2.41 nm, a second data point 1176 and about 32% SO2 and LER at 2.36 nm, a third data point 1174 and about 50% SO2 and LER at 2.31 nm, and a fourth data point 1170 and about 69% SO2 and LER at 2.33 nm. A range from about 35 to 70% SO2 to the total of oxygen and sulfur-containing gases is a tighter range that can be used for controlling the percentage SO2 and effectively the LWR and LER during the etch process steps. The best, (i.e., lowest) LWR and LER occur at about 2.31 at about 50% SO2 to the total of oxygen and sulfur-containing gases. Other operating variables, such as process chamber temperature, can also have an effect on the shape of the LWR and LER curves 1158 and 1178 respectively but not as significant as the effect of percentage of SO2.

Figure 12:
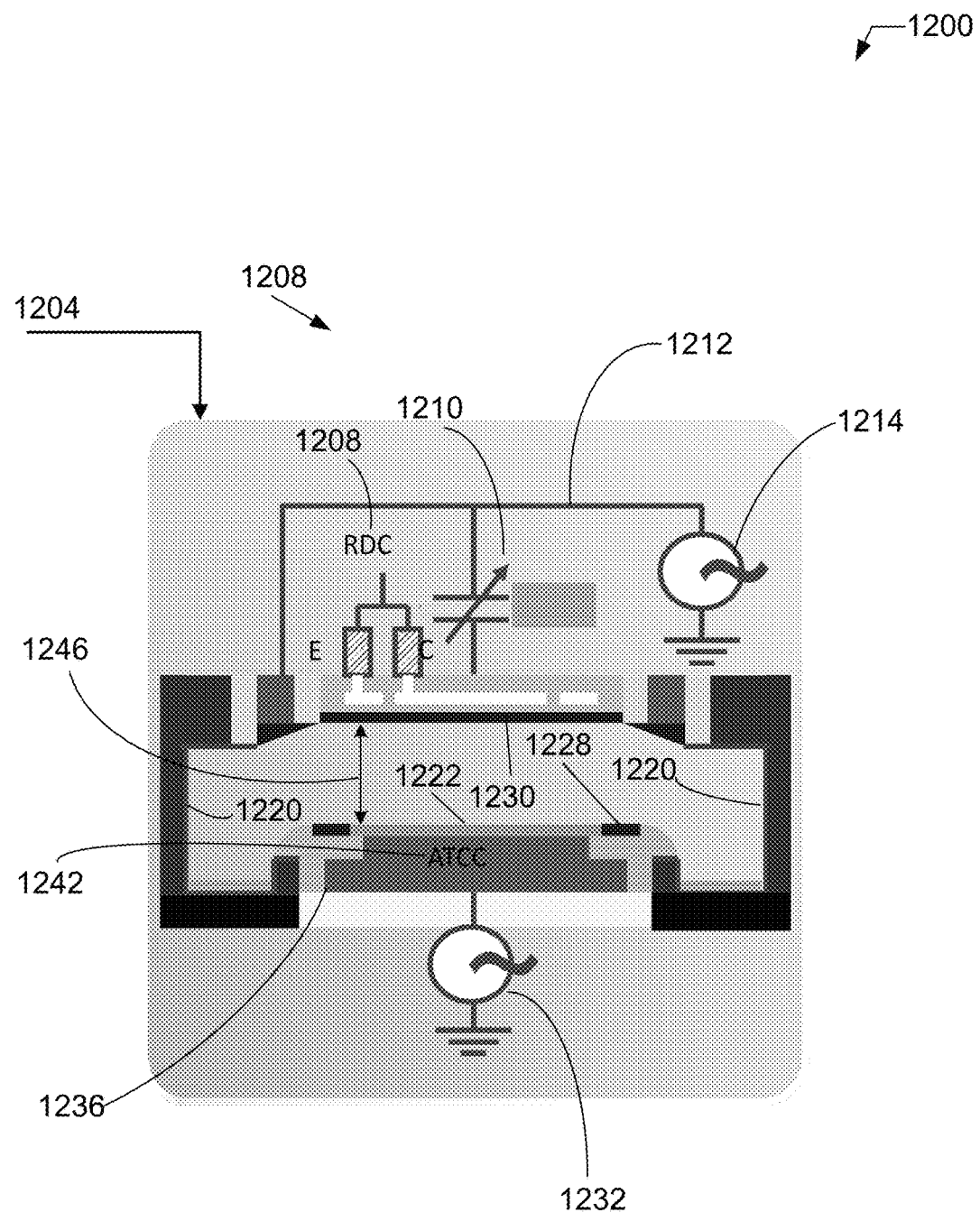
FIG. 12 is a schematic of an exemplary process chamber of the plasma processing system utilizing the DSA patterning process according to an embodiment of the present invention.

FIG. 12 is an exemplary schematic 1200 of an etch system 1208 utilizing the DSA patterning process in an embodiment of the present invention. The substrate 1222 is placed on top of an active temperature control chuck (ATCC) 1242 which includes a dual zone temperature control device 1236 that enables efficient control of the temperature of the substrate 1222. There are two electrodes comprising a top electrode 1230 and bottom electrode 1228. The two electrodes can be adjusted so that an optimum gap 1246 can be set and maintained between the top electrode 1230 and the bottom electrode 1228. The optimum gap 1246 is determined for each application using empirical data. The top power 1212 provided is split between the input power to the center upper electrode and the edge upper electrode using a variable condenser 1210 which provides control of the ion flux distribution. The radical distribution control (RDC) 1208 splits the incoming plasma source 1204 into a center (C) and an edge (E) zone. The flow ratio of the incoming gas plasma going to the center and edge can be controlled. The incoming plasma source is a capacitively coupled plasma (CCP) that uses decoupled plasma source with the top power 1214 at substantially 60 MHz and the bottom power 1232 at substantially 13 MHz. Decoupling the plasma power provides independent control of the ions and the radicals in the plasma. The process chamber walls 1220 are lined with a ceramic coating to minimize parts erosion. Other configurations of the etch system discussed in relation to FIG. 14 can also be used.

Figure 13A:
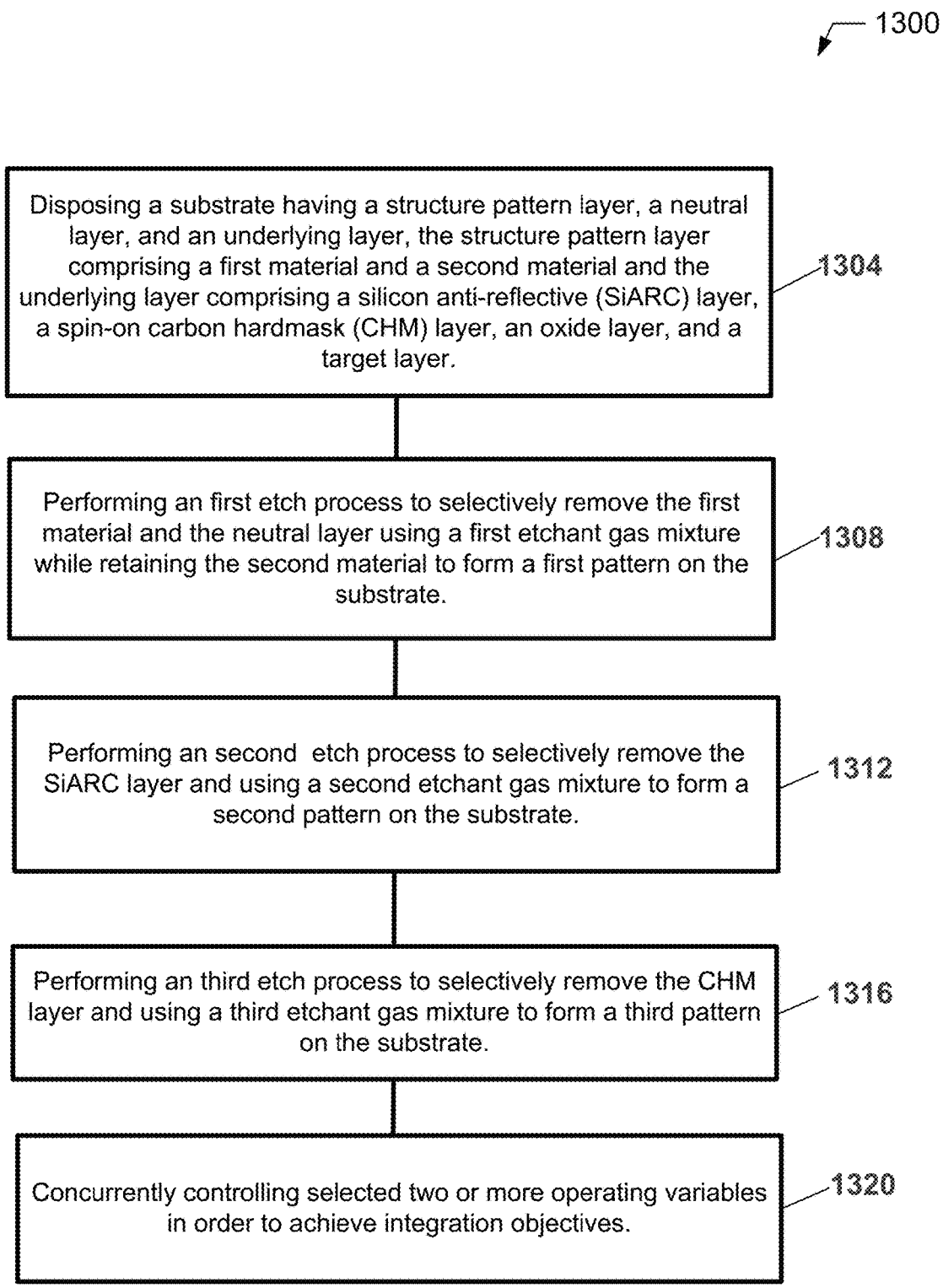
FIG. 13A is an exemplary process flow chart for a method of performing an integration scheme for a substrate using a DSA patterning process in one embodiment of the present invention.

FIG. 13A is an exemplary process flow chart for a method of performing a plasma etch for a substrate in one embodiment of the present invention. In operation 1304, a substrate having a structure pattern layer, a neutral layer, and an underlying layer, the structure pattern layer comprising a first material and a second material and the underlying layer can comprise a silicon anti-reflective (SiARC) layer, a spin-on carbon hardmask (CHM) layer, an oxide layer, and a target layer is disposed in a process chamber of a plasma etch system. Other set of materials in the underlying layer can also be used. In one embodiment, the substrate includes a directed self-assembly (DSA) pattern comprising a top layer that includes a block copolymer (BCP) comprising a first block copolymer and a second block copolymer. The first block copolymer can be PMMA and a second block copolymer can be polystyrene. Other copolymers can also be used. Other materials that behave in a manner similar to block copolymers can also be used. Connecting two adjacent second block copolymers is a neutral layer. The next layers of the underlying layer include a silicon anti-reflective coating (SiARC) layer, a spin-on carbon hard mask (CHM) layer, an oxide layer, and a silicon layer. The technology for fabricating the DSA pattern and the layers of the underlying layer is discussed above and is known to people in the art. Other structure pattern layers including a first and a second material can also be used.

In operation 1308, continuing with the DSA embodiment, a copolymer and neutral layer removal process is performed using a first etchant gas mixture. The first etchant gas mixture used can include an oxygen-containing gas, a sulfur-containing gas, and diluent gas. The oxygen-containing gas can include O2, CO, CO2 and the like. The sulfur-containing gas can be SO2 or COS. The diluent gas can be argon or one of the noble gases. As discussed in relation to FIG. 11A and FIG. 11B, the percentage of the sulfur-containing gas in relation to the total of the oxygen-containing gas and sulfur-containing gas is a very important factor in the PMMA/PS etch selectivity. The percentage of the sulfur-containing gas in relation to the total of the oxygen-containing gas and sulfur-containing gas is also a critical factor in the LER and LWR obtained after etch processing sequences on the substrate.

In operation 1312, a silicon anti-reflective coating (SiARC) etch process is performed using a second etchant gas mixture that can include a fluorine-containing gas, a halogen-containing gas, and a diluent. For example, the fluorine-containing gas can include CF4, CHF3, or SF6. C4F8, and the like or any combination of two or more thereof. The oxygen-containing gas can include O, $O_2$, $O_3$, CO, $CO_2$, NO, $N_2O$, $NO_2$, etc., and the diluent can be a noble gas, such as Ar or He or Xe. The halogen-containing gas may include one or more gases selected from the group consisting of $Cl_2$, $Br_2$, HBr, HCl, and $BCl_3$.

In operation 1316, a carbon hard mask (CHM) etch process is performed using a third etchant gas mixture. The third etchant gas mixture can include H2 and N2. In another embodiment, the third etchant gas mixture can include an oxygen-containing gas, a sulfur-containing gas, and diluent gas. The oxygen-containing gas can include O2, CO, CO2 and the like. The sulfur-containing gas can be SO2 or COS and the diluent gas can be Ar, N2, or He.

In operation 1320, selected operating variables are concurrently controlled during the first copolymer and neutral layer removal process, the SiARC etch process, and CHM etch process in order to achieve integration objectives. The target integration objectives can include a target etch selectivity of the first block copolymer over the second block copolymer, a target LER and a target LWR of the first, second, and third pattern on the substrate, a target substrate throughput, and/or a target cost of ownership (COO).

In one embodiment, the target LER can be in a range from 1.30 to 3.30 nm, the target LWR can be in a range from 1.70 to 4.20 nm, the target etch selectivity of the first block copolymer over the second block copolymer can be in a range from 1.8 to 4.0 or 2.0 to 3.8, and the ratio of SO2 to SO2 and O2 in percent can be in a range from 30 to 75% based on an extrapolation of the curves 1158 and 1178 in FIG. 11.

In another embodiment, the target LER is in a range from 1.20 to 2.50 nm, and/or the target LWR is in a range from 1.60 to 3.00 nm. The distance between an upper electrode and a lower electrode is in a range from 30 to 150 mm or in the range from 60 to 110 mm.

The process chamber temperature can be in range from 20 to 50 degrees C., the process chamber pressure in a range from 20 mT to 50 mT, source power for 60 MHz source can be from 100 to 500 W, and the bias power at 13 MHz or 40 MHz can be from 30 to 100 W. The SiARC etch process etchant gas flow rates can include HBr at 20 to 30 sccm, CF4 or at 60 to 90 sccm. The CHM etch process etchant mixture can include H2 at 250 to 350 sccm and N2 at 250 to 350 sccm.

Figure 13B:
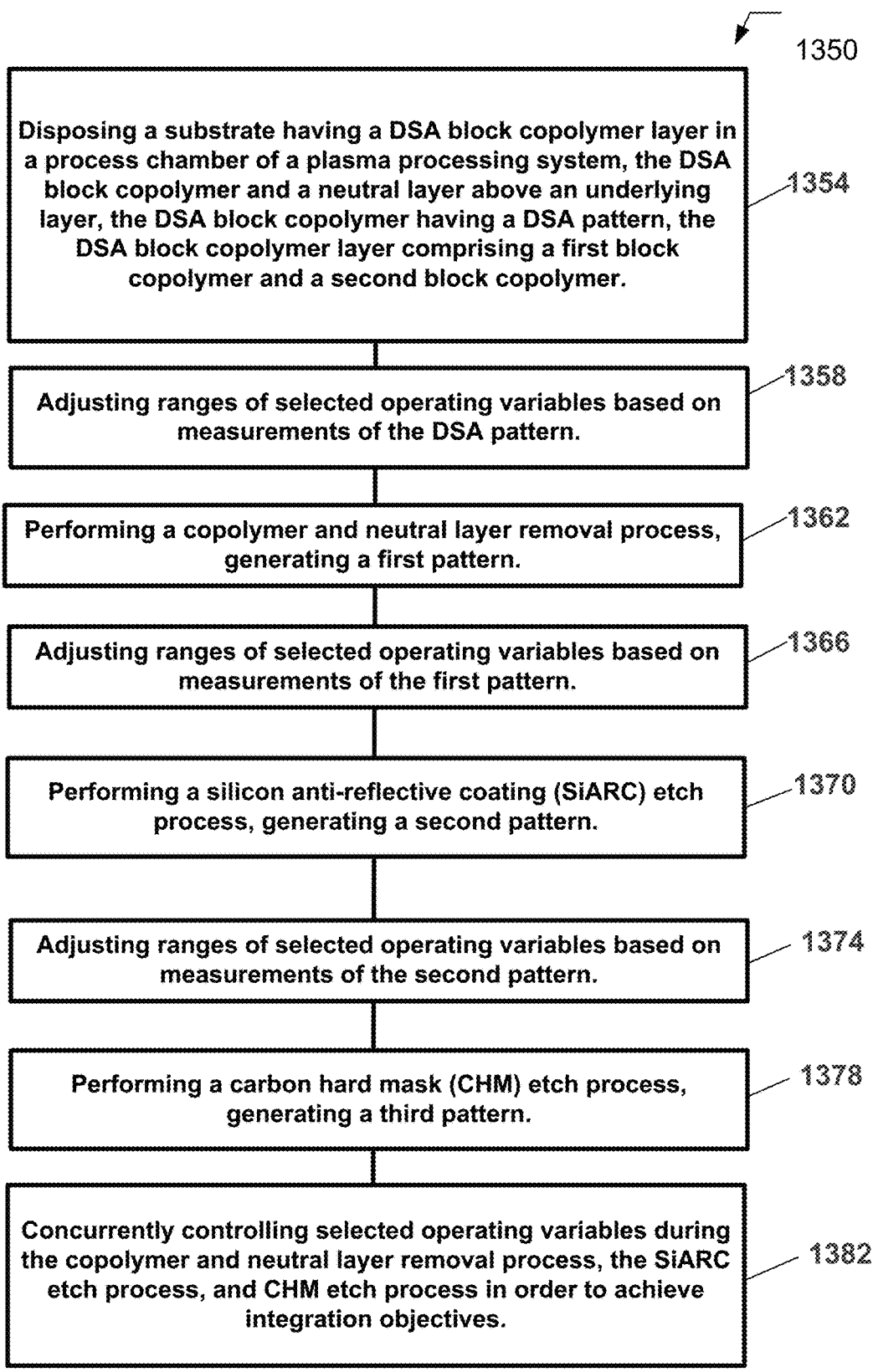
FIG. 13B is another exemplary process flow chart for a method of performing an integration scheme for a substrate using a DSA patterning process in another embodiment of the present invention.

FIG. 13B is an exemplary process flow chart for a method of performing a plasma etch for a substrate using a DSA patterning process in another embodiment of the present invention. In operation 1354, a substrate having a layer of copolymers patterned in a DSA process is provided. The substrate with a DSA pattern comprises a top layer that includes a block copolymer (BCP) comprising a first block copolymer and a second block copolymer. The first block copolymer can be PMMA and a second block copolymer can be polystyrene. Other copolymers can also be used. Other materials that behave in a manner similar to block copolymers can also be used. Connecting two adjacent second block copolymers is a neutral layer. The next layers of the underlying layer can include silicon anti-reflective coating (SiARC) layer, a spin-on carbon hard mask (CHM) layer, an oxide layer, and a silicon layer. The technology for fabricating the DSA pattern and the layers of the underlying layer is discussed above and is known to people in the art.

In operation 1358, selected operating variables are adjusted based on measurements of the incoming DSA pattern. The selected operating variables can include one or more of bias power, upper radio frequency, lower radio frequency, source power, pressure, temperature, and process time for each of the removal or etch processes, and flow rate of each gas of the first etchant gas mixture, flow rate of each gas of the second etchant gas mixture, flow rate of each gas of the third etchant gas mixture.

Measurements of the incoming DSA pattern can be performed using sensors or metrology devices including optical metrology devices, for example, broadband or laser-based metrology tools or optical emission spectroscopy (OES). Broadband metrology tools can include reflectometers, ellipsometers, and spectrometers. Laser-based metrology tools can process the refracted and/or the reflected beams to determine the profile of the DSA pattern. Based on the measurements of the DSA pattern, the ranges of the operating variables can be adjusted where the acceptable ranges can be narrowed or broadened. For example, the percentage of the sulfur-containing gas to the total oxygen and sulfur-containing gases can be adjusted based on the measured profile of the DSA pattern. Alternatively, for example, the acceptable etch selectivity of the first block copolymer relative to the second block copolymer can be expanded from 4.0 to 6.0 to 3.5 to 6.5 based on the measurements of the DSA pattern.

In operation 1362, a copolymer and neutral layer removal process is performed using a first etchant gas mixture, generating a first pattern. The first etchant gas mixture used can include an oxygen-containing gas, a sulfur-containing gas, and diluent gas. The oxygen-containing gas can include O2, CO, CO2 and the like. The sulfur-containing gas can be SO2 or COS. The diluent gas can be argon or one of the noble gases. As discussed in relation to FIG. 11A and FIG. 11B, the percentage of the sulfur-containing gas in relation to the total of the oxygen-containing gas and sulfur-containing gas is a very important factor in the PMMA/PS etch selectivity. The percentage of the sulfur-containing gas in relation to the total of the oxygen-containing gas and sulfur-containing gas is also a critical factor in the LER and LWR obtained as a result of processing sequences on the substrate.

In operation 1366, ranges of selected operating variables are adjusted based on measurements of the first pattern. The same process can be used to measure the first pattern as the one used to measure the DSA pattern. A similar procedure as the one used in operation 1358 can also be used to adjust the selected operating variables based on measurements of the first pattern.

In operation 1370, a silicon anti-reflective coating (SiARC) etch process is performed using a second etchant gas mixture that can include a fluorine-containing gas, a halogen-containing gas, and a diluent. For example, the fluorine-containing gas can include CF4, CHF3, or SF6. C4F8, and the like or any combination of two or more thereof. The oxygen-containing gas can include O, O2, O3, CO, CO2, NO, N2O, NO2, etc., and the diluent can be a noble gas, such as Ar or He or Xe. The halogen-containing gas may include one or more gases selected from the group consisting of Cl2, Br2, HBr, HCl, and BCl3.

In operation 1374, ranges of selected operating variables are adjusted based on measurements of the second pattern. In operation 1378, a carbon hard mask (CHM) etch process is performed using a third etchant gas mixture, generating a third pattern. The same process can be used to measure the first pattern as the one used to measure the DSA pattern. A similar procedure as the one used in operation 1358 can also be used to adjust the selected operating variables based on measurements of the third pattern.

In operation 1382, selected operating variables are concurrently controlled during the copolymer and neutral layer removal process, the SiARC etch process, and CHM etch process in order to achieve integration objectives. The target integration objectives include a target etch selectivity of the first block copolymer over the second block copolymer, a target LER and a target LWR of the first, second, and third patterns on the substrate, a target substrate throughput, and/or a target cost of ownership (COO).

In one embodiment, the target LER can be in a range from 1.30 to 3.30 nm, the target LWR can be in a range from 1.70 to 4.20 nm, the target etch selectivity of the first block copolymer over the second block copolymer can be in a range from 1.8 to 4.0 or 2.0 to 3.8, and the ratio of SO2 to the total of SO2 and O2 can be in a range from 1:1.0 to 1:0.25. In another embodiment, the target LER can be in a range from 1.20 to 2.50 nm, and/or the target LWR can be in a range from 1.60 to 3.00 nm. The distance between an upper electrode and a lower electrode can be in a range from 30 to 150 mm or in a range from 60 to 110 mm.

The process chamber temperature can be in range from 20 to 50 degrees C., the process chamber pressure can be in a range from 20 mT to 50 mT, source power for 60 MHz source can be from 100 to 500 W, and the bias power at 13 MHz or 40 MHz can be 30 to 100 W. The SiARC etch process etchant gas flow rates can include HBr at 20 to 30 sccm, CF4 at 60 to 90 sccm. The CHM etch process etchant mixture can include H2 at 250 to 350 sccm and N2 at 250 to 350 sccm.

Figure 14:
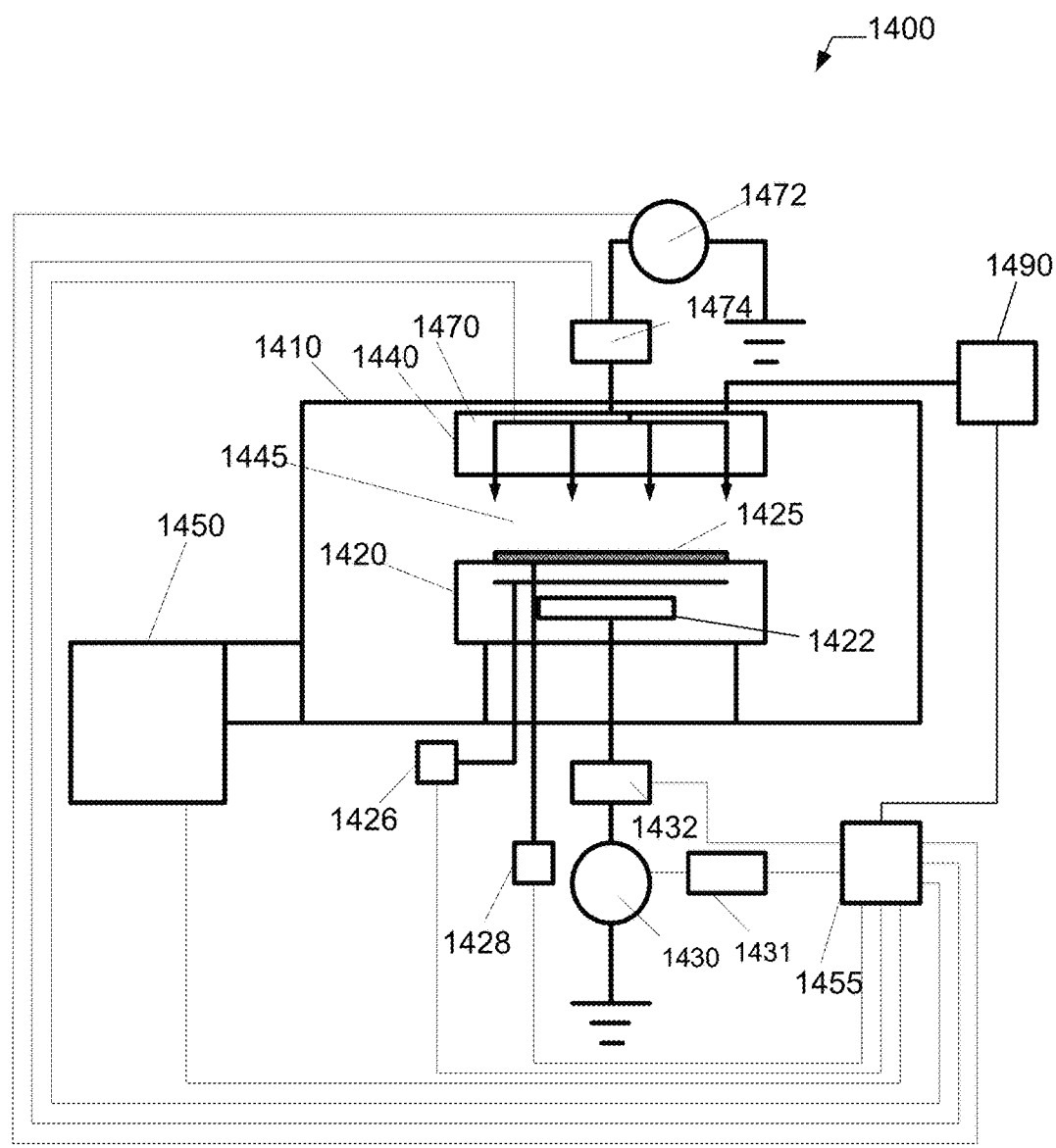
FIG. 14 is an exemplary systems chart including a controller of an integration system utilizing the DSA patterning process in an embodiment of the present invention.

FIG. 14 is an exemplary systems chart including a controller of an integration system utilizing the DSA patterning process in an embodiment of the present invention. A processing system 1400 configured to perform the above identified process conditions is depicted in FIG. 14 comprising a processing chamber 1410, substrate holder 1420, upon which a substrate 1425 to be processed is affixed, and vacuum pumping system 1450. Substrate 1425 can be a semiconductor substrate, a wafer, a flat panel display, or a liquid crystal display. Processing chamber 1410 can be configured to facilitate etching the processing region 1445 in the vicinity of a surface of substrate 1425. An ionizable gas or mixture of process gases is introduced via a gas distribution system 1440. For a given flow of process gas, the process pressure is adjusted using the vacuum pumping system 1450. The processing can aid the removal of material from the exposed surfaces of substrate 1425. The processing system 1400 can be configured to process substrates of any desired size, such as 200 mm substrates, 300 mm substrates, or larger.

Substrate 1425 can be affixed to the substrate holder 1420 via a clamping system 1428, such as a mechanical clamping system or an electrical clamping system (e.g., an electrostatic clamping system). Furthermore, substrate holder 1420 can include a heating system (not shown) or a cooling system (not shown) that is configured to adjust and/or control the temperature of substrate holder 1420 and substrate 1425. The heating system or cooling system can comprise a re-circulating flow of heat transfer fluid that receives heat from substrate holder 1420 and transfers heat to a heat exchanger system (not shown) when cooling, or transfers heat from the heat exchanger system to substrate holder 1420 when heating. In other embodiments, heating/cooling elements, such as resistive heating elements, or thermo-electric heaters/coolers can be included in the substrate holder 1420, as well as the chamber wall of the processing chamber 1410 and any other component within the processing system 1400.

Additionally, a heat transfer gas can be delivered to the backside of substrate 1425 via a backside gas supply system 1426 in order to improve the gas-gap thermal conductance between substrate 1425 and substrate holder 1420. Such a system can be utilized when temperature control of the substrate is required at elevated or reduced temperatures. For example, the backside gas supply system can comprise a two-zone gas distribution system, wherein the helium gas-gap pressure can be independently varied between the center and the edge of substrate 1425.

In the embodiment shown in FIG. 14, substrate holder 1420 can comprise an upper electrode 1470 and a lower electrode 1422 through which RF power is coupled to the processing region 1445. For example, substrate holder 1420 can be electrically biased at a RF voltage via the transmission of RF power from a RF generator 1430 through an optional impedance match network 1432 to substrate holder 1420. The RF electrical bias can serve to heat electrons to form and maintain plasma. In this configuration, the system can operate as a reactive ion etch (RIE) reactor, wherein the chamber and an upper gas injection electrode serve as ground surfaces. A typical frequency for the RF bias can range from about 0.1 MHz to about 80 MHz. RF systems for plasma processing are well known to those skilled in the art.

Furthermore, the electrical bias of electrode 1422 at an RF voltage may be pulsed using pulsed bias signal controller 1431. The RF power output from the RF generator 1430 may be pulsed between an off-state and an on-state, for example. Alternately, RF power is applied to the substrate holder electrode at multiple frequencies. Furthermore, impedance match network 1432 can improve the transfer of RF power to plasma in plasma processing chamber 1410 by reducing the reflected power. Match network topologies (e.g. L-type, Pi-type, T-type, etc.) and automatic control methods are well known to those skilled in the art.

Gas distribution system 1440 may comprise a showerhead design for introducing a mixture of process gases. Alternatively, gas distribution system 1440 may comprise a multi-zone showerhead design for introducing a mixture of process gases and adjusting the distribution of the mixture of process gases above substrate 1425. For example, the multi-zone showerhead design may be configured to adjust the process gas flow or composition to a substantially peripheral region above substrate 1425 relative to the amount of process gas flow or composition to a substantially central region above substrate 1425 or split into a center flow and an edge flow.

Vacuum pumping system 1450 can include a turbo-molecular vacuum pump (TMP) capable of a pumping speed up to about 8000 liters per second (and greater) and a gate valve for throttling the chamber pressure. In conventional plasma processing devices utilized for dry plasma etching, an 800 to 3000 liter per second TMP can be employed. TMPs are useful for low pressure processing, typically less than about 50 mTorr. For high pressure processing (i.e., greater than about 80 mTorr), a mechanical booster pump and dry roughing pump can be used. Furthermore, a device for monitoring chamber pressure (not shown) can be coupled to the plasma processing chamber 1410.

As mentioned above, the controller 1455 can comprise a microprocessor, memory, and a digital I/O port capable of generating control voltages sufficient to communicate and activate inputs to processing system 1400 as well as monitor outputs from plasma processing system 1400. Moreover, controller 1455 can be coupled to and can exchange information with RF generator 1430, pulsed bias signal controller 1431, impedance match network 1432, the gas distribution system 1440, vacuum pumping system 1450, as well as the substrate heating/cooling system (not shown), the backside gas supply system 1426, and/or the electrostatic clamping system 1428. For example, a program stored in the memory can be utilized to activate the inputs to the aforementioned components of processing system 1400 according to a process recipe in order to perform a plasma assisted process, such as a plasma etch process or a PHT process, on substrate 1425.

In addition, the processing system 1400 can further comprise an upper electrode 1470 to which RF power can be coupled from RF generator 1472 through optional impedance match network 1474. A frequency for the application of RF power to the upper electrode can range from about 0.1 MHz to about 200 MHz. Additionally, a frequency for the application of power to the lower electrode can range from about 0.1 MHz to about 80 MHz. Moreover, controller 1455 is coupled to RF generator 1472 and impedance match network 1474 in order to control the application of RF power to upper electrode 1470. The design and implementation of an upper electrode is well known to those skilled in the art. The upper electrode 1470 and the gas distribution system 1440 can be designed within the same chamber assembly, as shown. Alternatively, upper electrode 1470 may comprise a multi-zone electrode design for adjusting the RF power distribution coupled to plasma above substrate 1425. For example, the upper electrode 1470 may be segmented into a center electrode and an edge electrode.

The DC power supply 1490 can include a variable DC power supply. Additionally, the DC power supply 1490 can include a bipolar DC power supply. The DC power supply 1490 can further include a system configured to perform at least one of monitoring, adjusting, or controlling the polarity, current, voltage, or on/off state of the DC power supply 1490. Once plasma is formed, the DC power supply 1490 facilitates the formation of a ballistic electron beam. An electrical filter (not shown) may be utilized to de-couple RF power from the DC power supply 1490.

Depending on the applications, additional devices such as sensors or metrology devices can be coupled to the processing chamber 1410 and to the controller 1455 to collect real time data and use such real time data to concurrently control two or more selected integration operating variables in two or more steps involving deposition processes, RIE processes, pull processes, profile reformation processes, heating treatment processes and/or pattern transfer processes of the integration scheme. Furthermore, the same data can be used to ensure integration targets including completion of post heat treatment (PHT), patterning uniformity (uniformity), pulldown of structures (pulldown), slimming of structures (slimming), aspect ratio of structures (aspect ratio), etch selectivity, line edge roughness (LER), line width roughness (LWR), substrate throughput, cost of ownership, and the like are achieved.

The processing system 1400 can be similar to the embodiment in FIG. 14 and can further comprise an inductive coil (not shown) to which RF power is coupled via RF generator through optional impedance match network (not shown). RF power is inductively coupled from inductive coil through a dielectric window (not shown) to plasma processing region. A frequency for the application of RF power to the inductive coil can range from about 10 MHz to about 100 MHz.

The processing system 1400 can further comprise an inductive coil window (not shown) that is a "spiral" coil or "pancake" coil in communication with the plasma processing region from above as in transformer coupled plasma (TCP) reactor. The design and implementation of an inductively coupled plasma (ICP) source (not shown), or transformer coupled plasma (TCP) source (not shown), is well known to those skilled in the art.

The processing system 1400 can further comprise surface wave plasma (SWP) source (not shown). The SWP source can comprise a slot antenna (not shown), such as a radial line slot antenna (RLSA), to which microwave power is coupled via a power coupling system (not shown). Other plasma processing systems can be used, the description of such systems can be found in U.S. Pat. No. 9,443,731 entitled "Material processing to achieve sub-10 nm patterning", issued on Sep. 13, 2016; the content of which is herein incorporated by reference in its entirety.

Although only certain embodiments of this invention have been described in detail above, those skilled in the art will readily appreciate that many modifications are possible in the embodiments without materially departing from the novel teachings and advantages of this invention. Although the DSA embodiment is used to explain the principles, features, and benefits of the present invention, as mentioned above, the invention can be used for substrates with other structure pattern layers that can include two or more materials. Accordingly, all such modifications are intended to be included within the scope of this invention.

The invention claimed is:

1. A method of plasma etching on a substrate using one or more etchant gas mixtures to meet integration objectives, the method comprising:

disposing a substrate having a structure pattern layer, a neutral layer, and an underlying layer, the structure pattern layer comprising a first material and a second material and the underlying layer comprising a silicon anti-reflective (SiARC) layer, a spin-on carbon hardmask (CHM) layer, an oxide layer, and a target layer;

performing a first etch process to selectively remove the first material and the neutral layer using a first etchant gas mixture while retaining the second material to form a first pattern on the substrate; and concurrently controlling selected two or more operating variables of the integration scheme in order to achieve target integration objectives;

wherein the first etchant gas mixture include an oxygen-containing gas, a sulfur-containing gas, and a diluent gas; and wherein the target integration objectives include a target etch selectivity of the first material over the second material, a target line edge roughness (LER) and a target line wide roughness (LWR) of the first pattern and the third pattern on the substrate, and/or a target substrate throughput.

2. The method of claim 1 further comprising:

performing a second etch process to selectively remove the SiARC layer and using a second etchant gas mixture to form a second pattern on the substrate; and performing a third etch process to selectively remove the CHM layer and using a third etchant gas mixture to form a third pattern on the substrate.

3. The method of claim 2, the first material is a first block copolymer and the second material is a second block copolymer.

4. The method of claim 3, wherein the first block copolymer is poly(methylmethacrylate), and the second self-assembled block copolymer is polystyrene.

5. The method of claim 4, wherein the oxygen-containing gas is oxygen and the sulfur-containing gas is SO2 or COS and the diluent gas is argon.

6. The method of claim 5, wherein the target LER is in a range from 1.30 to 3.30 and the target LWR is in a range from 1.70 to 4.20 nm.

7. The method of claim 6, wherein the target etch selectivity of the first material over the second material is in a range from 1.8 to 4.0.

8. The method of claim 7, wherein the ratio of SO2 to the total of (SO2 and O2) in percent is in the range from 30 to 75%.

9. The method of claim 8 wherein the two or more operating variables include two or more of bias power, upper radio frequency, lower radio frequency, source power, pressure, temperature, flow rate of each of the first etchant gas mixture, flow rate of each of the third etchant gas mixture, process time, and/or a ratio of etchant gas mixture delivered at a center of the substrate compared to etchant gas mixture delivered at an edge of the substrate.

10. The method of claim 9, wherein the target LER is in a range from 1.20 to 2.50 nm, and/or the target LWR is in a range from 1.60 to 3.00 nm.

11. The method of claim 10, wherein distance between an upper electrode and a lower electrode in the processing chamber is controlled based on a type of film used in the underlying layer of the substrate being processed.

12. The method of claim 11, wherein the distance between an upper electrode and a lower electrode is in the range from 30 to 150 mm.

13. The method of claim 11, wherein the distance between an upper electrode and a lower electrode is an optimum distance determined for a given application using empirical data.

14. The method of claim 11, wherein the input radio frequency (RF) power to a center upper electrode and an edge upper electrode is controlled by changing capacitance using a variable condenser.

15. The method of claim 11, wherein the process chamber includes a gas distribution system and a flow splitter to split the etchant gas mixture into a etchant gas mixture delivery at a center of the substrate and another etchant gas mixture delivery at an edge of the substrate.

16. The method of claim 15, wherein the gas distribution system controls distribution of etchant radicals of the etchant gas mixture by adjusting a flow ratio of the gas delivery at the center and the gas delivery at the edge of the substrate.

17. The method of claim 16, wherein a plasma source power comprising a top bias power and a bottom bias power are decoupled in order to enable independent control of ion and/or radicals of the first or second etchant gas mixture.

18. The method of claim 17, wherein an active temperature control chuck has at least a first zone ranging from 0 mm to 130 mm from a center of the substrate and a second zone ranging from 131 to 148 mm from the center of the substrate.

19. The method of claim 18, wherein the plasma processing system comprises a controller configured with computer code and/or physical circuitry to control selected operating variables for the first etch process, the second etch process, and/or the third etch process in order to achieve the target integration objectives.

20. A method of plasma etching on a substrate using a directed self-assembly (DSA) integration scheme, the method comprising:
disposing a substrate having a DSA block copolymer layer in a process chamber of a plasma etching system, the self-assembled block copolymer and a neutral layer above an underlying layer, the DSA block copolymer having a DSA pattern, the self-assembled block copolymer layer comprising a first block copolymer and a second block copolymer, the underlying layer comprising a silicon anti-reflective (SiARC) layer, a spin-on carbon hardmask (CHM) layer, an oxide layer, and a target layer;
adjusting ranges of selected operating variables based on measurements of the DSA pattern;
performing an first etch process to selectively remove the neutral layer and the first block copolymer using a first etchant gas mixture while retaining a second block copolymer to form a first pattern on the substrate;
adjusting ranges of selected operating variables based on measurements of the first pattern;
performing an second etch process to selectively remove the SiARC layer using a second etchant gas mixture to form a second pattern on the substrate;
adjusting ranges of selected operating variables based on measurements of the second pattern;
performing an third etch process to selectively remove the CHM layer and using a third etchant gas mixture to form a third pattern on the substrate; and
controlling two or more operating variables of the integration scheme in order to achieve target integration objectives;
wherein the first etchant gas mixture include an oxygen-containing gas, a sulfur-containing gas, and a diluent gas; and
wherein the target integration objectives include a target etch selectivity of the first block copolymer over the second block copolymer, a target line edge roughness (LER) and a target line wide roughness (LWR) of the first pattern, the second pattern, and/or the third pattern on the substrate, and/or a target substrate throughput.

21. The method of claim 20, wherein the self-assembled first block copolymer is poly(methylmethacrylate), the second self-assembled block copolymer is polystyrene, the oxygen-containing gas is oxygen and the sulfur-containing gas is SO2 or COS and the diluent gas is argon.

22. The method of claim 21, wherein the target etch selectivity of the first material over the second material is in a range from 1.8 to 4.0 or 2.0 to 3.8, the target LER is in a range from 1.30 to 3.30 nm and the target LWR is in a range from 1.70 to 4.20 nm.

23. A system for patterning a structure layer on a substrate using a patterning system, the system comprising:
a plasma etch system configured to etch a substrate having a structure pattern layer, a neutral layer, and an underlying layer, the structure pattern layer comprising a first material and a second material and the underlying layer comprising a silicon anti-reflective (SiARC) layer, a spin-on carbon hardmask (CHM) layer, an oxide layer, and a target layer; the plasma etch system comprising:
a process chamber configured to process the substrate using a first etchant gas mixture; a second etchant gas mixture, a third etchant gas mixture;

a plasma source coupled to the process chamber and configured to deliver plasma ions and radicals into a center flow and an edge flow using a radical distribution control device;
a top electrode and a bottom electrode coupled to the process chamber and configured to adjust a gap of the top electrode to the bottom electrode; and
an active temperature control chuck coupled to the process chamber and configured with a dual zone temperature control and coupled to the process chamber; and
a controller coupled to the plasma etch system, the controller configured to control operating variables in order to meet integration objectives;
wherein the first etchant gas mixture includes an oxygen-containing gas, a sulfur-containing gas, and a diluent gas; and
wherein the integration objectives comprise a target etch selectivity of the first material over the second, a target line edge roughness (LER), a target line width roughness (LWR), and the target ratio of SO2 to the total of (SO2 and O2).

\* \* \* \* \*